United States Patent
Langhammer

(10) Patent No.: US 7,109,895 B1
(45) Date of Patent: Sep. 19, 2006

(54) HIGH PERFORMANCE LEMPEL ZIV COMPRESSION ARCHITECTURE

(75) Inventor: Martin Langhammer, Salisbury, Alderbury (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/049,072

(22) Filed: Feb. 1, 2005

(51) Int. Cl.
*H03M 7/34* (2006.01)

(52) U.S. Cl. ............ 341/51; 341/63; 341/65; 341/67; 341/106

(58) Field of Classification Search ............ 341/51, 341/63, 65, 67, 106
See application file for complete search history.

(56) References Cited

U.S. PATENT DOCUMENTS

| | | | | |
|---|---|---|---|---|
| 5,003,307 A | * | 3/1991 | Whiting et al. | 341/51 |
| 5,150,430 A | * | 9/1992 | Chu | 382/246 |
| 5,525,982 A | * | 6/1996 | Cheng et al. | 341/51 |
| 5,874,907 A | * | 2/1999 | Craft | 341/51 |
| 5,930,790 A | * | 7/1999 | Law et al. | 707/6 |
| 6,127,950 A | * | 10/2000 | Yamauchi | 341/55 |
| 6,392,571 B1 | * | 5/2002 | Chen et al. | 341/60 |

* cited by examiner

*Primary Examiner*—Rexford Barnie
*Assistant Examiner*—Khai Nguyen
(74) *Attorney, Agent, or Firm*—Townsend and Townsend and Crew LLP

(57) ABSTRACT

A data compression architecture includes a shift register with multiple shift register elements. A data input receives input data characters, and applies each received input data character to the shift register, such that the received input data character is stored in each shift register element of said shift register in turn. Logic circuitry is associated with each shift register element of the shift register, for detecting a match when the comparison circuitry determines that a sequence of two or more received input data characters is equal to a sequence stored in the shift register. A flush input receives a data flush input signal, and applies a received data flush input signal to the logic circuitry associated with each shift register element of the shift register, such that no match is detected by said logic circuitry when the data flush input signal is received.

12 Claims, 2 Drawing Sheets

HIGH PERFORMANCE LEMPEL ZIV COMPRESSION ARCHITECTURE

CROSS-REFERENCES TO RELATED APPLICATIONS

Not applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

This invention relates to data compression, and in particular to a hardware architecture that can be used to achieve data compression in accordance with the Lempel-Ziv compression algorithm.

When transmitting data over a communications channel, or when storing data, it is often useful to be able to compress the data, in order to reduce the resources required to transmit or store the data. Data compression techniques rely on the fact that most useful data contains patterns, which can be exploited in order to reduce the amount of data required in order to represent the source data. For example, when the source data contains one or more repeated sequences of characters, each of these can be represented more efficiently by a particular code. Provided of course that the code contains fewer bits of data than the sequence of characters, this representation reduces the amount of data required to represent the source data.

One well known data compression algorithm is the Lempel-Ziv data compression algorithm, originally described in the paper "A Universal Algorithm for Sequential Data Compression", Jacob Ziv and Abraham Lempel, IEEE Transactions on Information Theory, vol. IT-23, no. 3, May 1977, pages 337–343. In use of the Lempel-Ziv algorithm, a code dictionary is built up, based on the received data string. The received data can for example represent text made up of characters. Then, the available codes can be assigned to respective character strings, as they appear in the received text.

In practice, this is achieved by comparing received character strings with previously received character strings. More specifically, it is necessary to find the longest of the previously received character strings that can be matched with a newly received character string. The next character of the newly received character string is then combined with that longest of the previously received character strings to form a character string that can be represented by a new code.

It is known to provide a hardware apparatus for comparing received data with previously received character strings.

For example, U.S. Pat. No. 5,003,307 to Whiting et al discloses an apparatus comprising a shift register. A newly received character is input to a first stage of the shift register. At the same time, the newly received character is compared with the characters stored in the other stages of the shift register. Logic circuitry is used to identify stages in the shift register at which the newly received character matches the stored characters. This process continues until the string of newly received characters no longer matches the strings of previously received characters at any of the stages of the shift register. At that time, the new code is output.

However, this architecture has the disadvantage that, when a match occurs, the encoding process has to stop for one clock cycle while a new search is started. This reduces the speed at which data can be processed by the device.

Jung and Burleson, in the paper "Efficient VLSI for Lempel-Ziv Compression in Wireless Data Communication Networks", IEEE Transactions on Very Large Scale Integration (VLSI) Systems, vol. 6, no. 3, September 1998 propose an alternative architecture. However, it is desirable to improve the speed of operation of a compression architecture.

BRIEF SUMMARY OF THE INVENTION

According to the present invention, there is provided a data compression architecture, including a shift register with multiple shift register elements. A data input receives input data characters, and applies each received input data character to the shift register, such that the received input data character is stored in each shift register element of said shift register in turn. Comparison circuitry is associated with each shift register element of the shift register, for comparing each received input data character with a respective input data character stored in said shift register element of the shift register. Logic circuitry is associated with each shift register element of the shift register, for detecting a match when the comparison circuitry determines that the received input data character is equal to the respective input data character stored in the shift register element of the shift register. A flush input receives a data flush input signal, and applies a received data flush input signal to the logic circuitry associated with each shift register element of the shift register, such that no match is detected by said logic circuitry when the data flush input signal is received.

According to the present invention, there is provided a data compression architecture, comprising a shift register, comprising multiple shift register elements. A data input receives input data characters, and applies each received input data character to the shift register, such that the received input data character is stored in each shift register element of the shift register in turn. Comparison circuitry is associated with each shift register element of the shift register, for comparing each received input data character with a respective input data character stored in the shift register element of the shift register. Logic circuitry is associated with each shift register element of the shift register, for detecting a match when the comparison circuitry determines that the received input data character is equal to the respective input data character stored in the shift register element of the shift register in two consecutive clock cycles, and for supplying a match output when the received input data character is equal to the respective input data character stored in the shift register element of the shift register in two consecutive clock cycles and when a match output criterion is met.

DETAILED DESCRIPTION OF THE INVENTION

Figure 1:
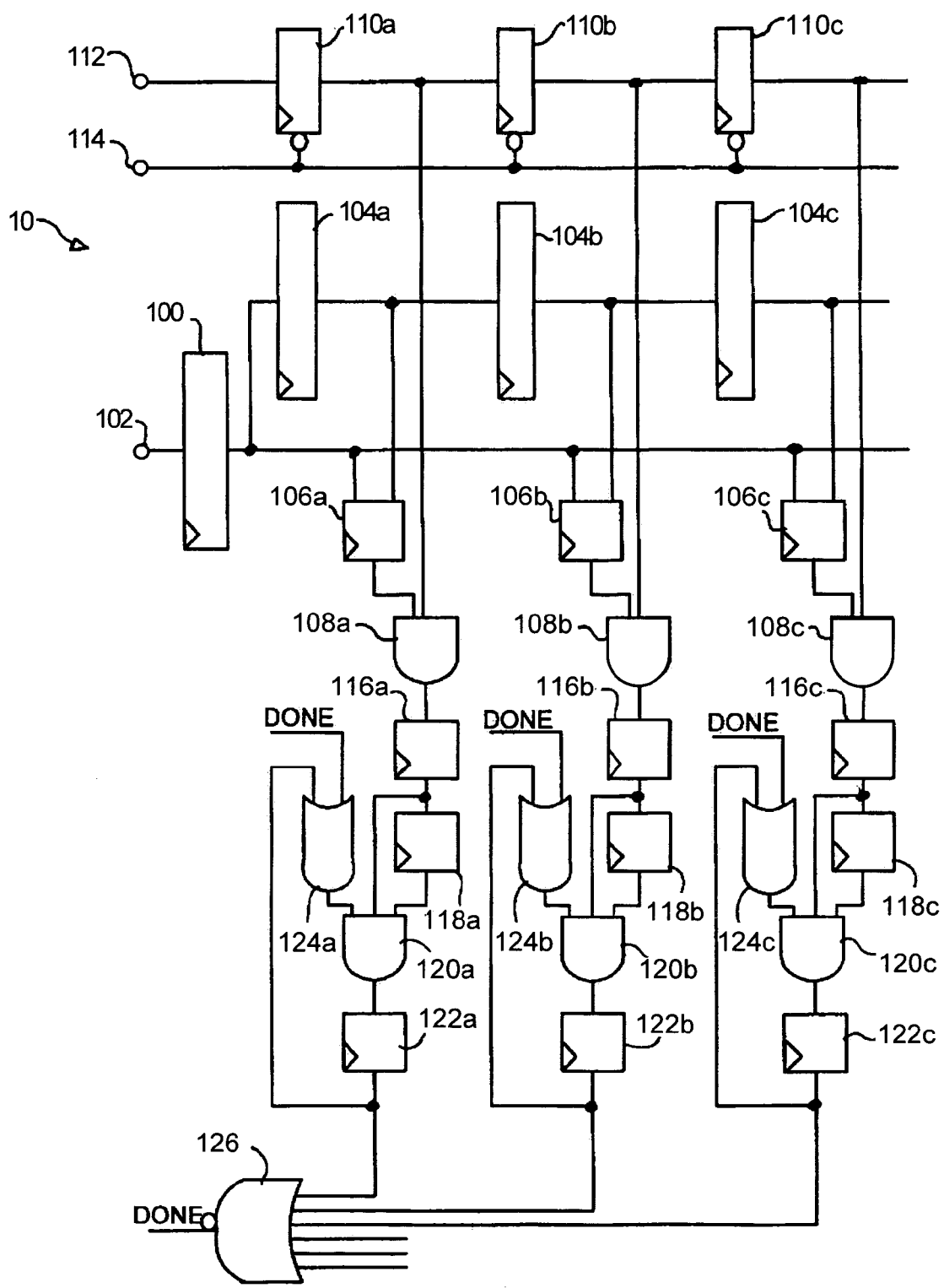
FIG. 1 is a block schematic diagram of a shift register structure, forming part of a compression architecture in accordance with the present invention.

FIG. 1 shows a shift register structure 10, forming part of a compression architecture, for achieving data compression, according to the Lempel-Ziv algorithm, which is well known to the person skilled in the art, and will not be described in detail herein, except in so far as is necessary for an understanding of the present invention.

In the preferred embodiment of the invention, the compression architecture is implemented in a field-programmable gate array (FPGA). However, it will be appreciated that the architecture can be implemented in any form of device, as required.

The Lempel-Ziv algorithm operates by detecting when a sequence of received characters matches a sequence that has been previously received. The algorithm proceeds on a character-by-character basis. That is, when a first character is received, it may be found that the same character has been received on many previous occasions. When a second character is received, it may then be found that the sequence of the first and second characters was received on some fraction of those previous occasions. Further characters are then received, until the longest previously received sequence, matching that newly received sequence, is found.

In order to detect the matching of the sequences, a shift register structure is used, as shown in FIG. 1. As will be apparent from the following description, FIG. 1 shows only three stages of the shift register, for ease of illustration and explanation. However, the shift register structure can contain any desired number of stages and, in a practical embodiment of the invention, the shift register structure can contain several hundreds or several thousands of stages. The data stored in the shift register structure in effect makes up a dictionary of received character strings.

A flip-flop 100 is connected to an input 102 of the circuit, and receives an input data word. Typically, the input data word is 8 bits long, and may for example represent a character in a text, although the algorithm can be used with data of many types.

During a following clock cycle, the input data word is clocked into the first stage of the shift register structure. In FIG. 1, and the following description, components of the first stage of the shift register structure are indicated by the suffix "a" appended to their reference numerals, components of the second stage of the shift register structure are indicated by the suffix "b" appended to their reference numerals, and components of the third stage of the shift register structure are indicated by the suffix "c" appended to their reference numerals. These stages all contain the same components, and operate in the same way.

Thus, in the clock cycle following its receipt, the input data word is clocked into the shift register element 104a of the first stage of the shift register structure. The shift register elements 104b, 104c are connected to the shift register element 104a, such that, during subsequent clock cycles, the input data word is clocked into the shift register element 104b, and then into the shift register element 104c, and so on.

The output of the shift register element 104a is also connected to a first input of a match block 106a. In the other stages of the shift register structure, the outputs of the shift register elements 104b, 104c etc are also connected to the respective first inputs of the match blocks 106b, 106c. The output of the flip-flop 100 is connected to a second input of the match block 106a, as well as to the second inputs of the other match blocks 106b, 106c.

The match block 106a outputs a logical "1" when the value stored in the flip-flop 100 matches the value stored in the shift register element 104a.

The output of the match block 106a is connected to a first input of a logical AND gate 108a, the operation of which will be described in more detail below.

The circuit also includes a flush shift register, containing a respective one-bit flush shift register element 110a, 110b, 110c, etc associated with each stage of the shift register structure. During operation of the circuit, it may be desirable to clear the dictionary of received character strings. For example, it is often the case that the most efficient compression of received data can be achieved by comparing the received data only with recently received data, rather than with data that was received less recently. More specifically, when the source of received data changes, it is usually desirable for the new data to be compressed without any reference to the previous set of data.

However, it is not desirable simply to clear the shift register elements 104a, 104b, 104c etc, because this would mean that a received string of 0's would appear to match the stored data.

An enable input 112 is connected to the input of the flush shift register element 110a, and is clocked on subsequent cycles to the inputs of the flush shift register elements 110b, 110c, etc. When the circuit is initialized, that is, when the first data word is input to the flip-flop 100 from the input 102, a logical "1" is input at the enable input 112, and this high level signal is loaded sequentially into each flush shift register element of the flush shift register on subsequent clock cycles.

A flush input 114 is connected, inverted, to the clear inputs of each of the flush shift register elements 110a, 110b, 110c, etc. When it is desired to clear the dictionary, for example when data is first received from a new dataset, a logical "1" is input at the flush input 114. All of the flush shift register elements 110a, 110b, 110c are then cleared within a single clock cycle.

Thus, the output of any one of the flush shift register elements 110a, 110b, 110c is high only when the logical "1", input at the enable input 112, has propagated sufficiently far along the flush shift register to reach that element, and only for so long as a logical "1" has not been input at the flush input 114.

The output of the flush shift register element 110a is connected to a second input of the logical AND gate 108a mentioned above. The outputs of the flush shift register elements 110b, 110c etc in the other stages are connected to the second inputs of the corresponding logical AND gates 108b, 108c etc.

Thus, provided that the output of the flush shift register element 110a is high, the logical AND gate 108a outputs a high signal, whenever the match block 106a outputs a high signal. Thus, this arrangement allows the dictionary to be flushed in a single clock cycle, or even during continuous data input.

The output of the logical AND gate 108a is connected to a register 116a. The output of the register 116a is connected to a further register 118a. Any signal input to the register 116a is thus applied to the further register 118a in the subsequent clock cycle.

The outputs of the register 116a and the further register 118a are applied to first and second inputs respectively of a three-input logical AND gate 120a. The output of the three-input logical AND gate 120a is then applied to a further register 122a. The output of the further register 122a is applied to the first input of an OR gate 124a.

The outputs of the further registers 122a, 122b, 122c etc in all of the stages of the circuit are then applied to respective inputs of a NOR gate 126.

The output of the NOR gate 126 forms a DONE signal, which is applied to the second inputs of the OR gates 124a, 124b, 124c etc in all of the stages of the circuit. Then the outputs of the OR gates 124a, 124b, 124c etc are applied to the respective third inputs of the three-input logical AND gate 120a.

In operation of the circuit, when the value stored in the flip-flop 100 matches the value stored in the shift register element 104a, the match block 106a outputs a logical "1". Assuming that the output of the flush shift register element 110a is high, the logical AND gate 108a outputs a high signal, and this high signal is clocked into the register 116a. The high signal is then clocked into the register 118a during the next clock cycle.

The AND gate 120 therefore receives high signals on its first and second inputs when the register 116a produces a high output in two consecutive clock cycles. This occurs when a sequence of two consecutive values, received and stored in the flip-flop 100 during consecutive clock cycles, matches a sequence of two values stored in the shift register element 104a during those two clock cycles, given that the received data signals are being clocked through the shift register elements 104a, 104b, 104c . . . during consecutive clock cycles.

In that situation, then, if the signal on the third input of the AND gate 120a, from the output of the OR gate 124a, is also high, then the output of the AND gate 120a will be high, and the match register 122a will be set.

Thus, the match register 122a can be set only when a sequence of two or more of the received input data characters matches a sequence of the stored, previously received, data characters.

Since the output of the match register 122a is connected to one of the inputs of the OR gate 124a, then, if the match register 122a was previously set, it will remain set during the subsequent clock cycle, if the AND gate 120 is receiving high signals on its first and second inputs.

Moreover, the match register 122a will be set, provided that the AND gate 120 is receiving high signals on its first and second inputs, when the DONE signal is high.

When one or more of the match registers 122a, 122b, 122c etc in the different stages is set, the DONE signal on the output of the NOR gate 126 is low. The DONE signal on the output of the NOR gate 126 only becomes high when none of the match registers 122a, 122b, 122c etc in the different stages is set. This occurs when a received sequence of two or more of the received input data characters, matching a sequence of the stored input data characters, comes to an end.

Figure 2:
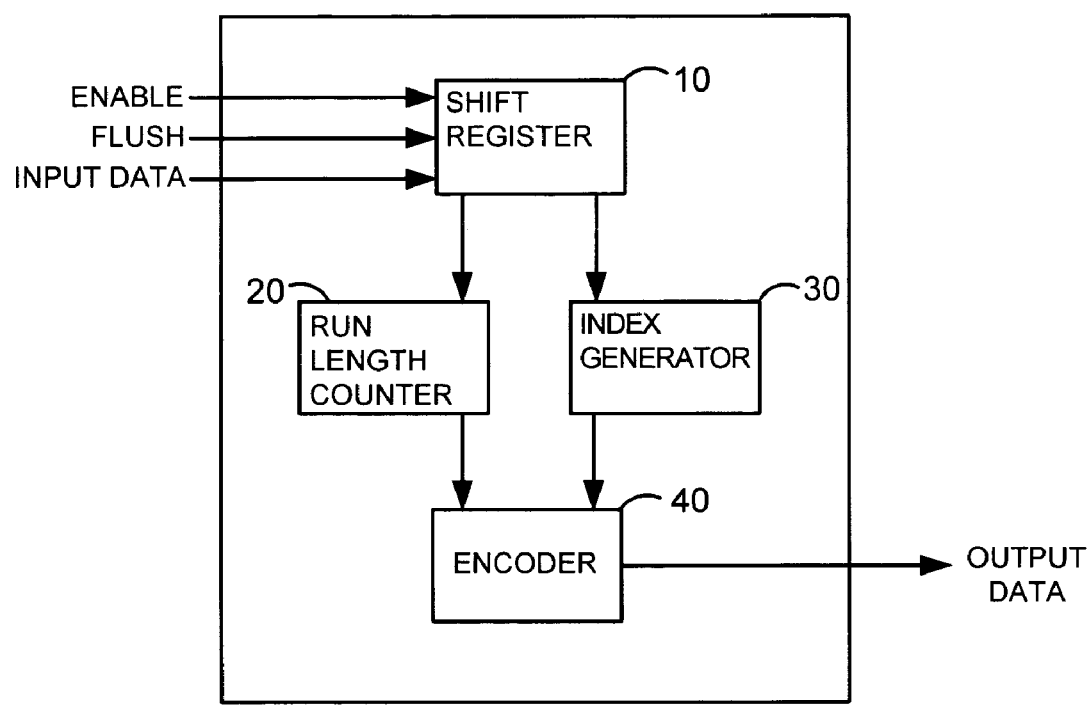
FIG. 2 is a block schematic diagram of a compression architecture in accordance with the present invention.

FIG. 2 is a block schematic diagram of a data compression architecture including the shift register structure 10. More specifically, the shift register structure 10 of the data compression architecture receives input data, which is supplied to the flip-flop 100 as described above, an enable signal, which is applied to the enable input 112, and a flush signal, which is applied to the flush input 114.

In order to produce an output code in the form <index, runlength>, the data compression architecture also includes a run length counter 20 and an index generator 30, each connected to the shift register structure 10. The outputs of the run length counter 20 and the index generator 30 are then supplied to an encoder 40, so that the encoder 40 can provide the output encoded data.

The run length counter 20 receives the DONE signal from the NOR gate 126, and is used to count the number of consecutive matches between the received data and the stored data. Since the combination of the registers 116a, 118a means that a match is detected by the AND gate 120 only when two consecutive characters match, the run length counter is initialized to the value 2, and increases the count by 1 for each clock cycle in which a DONE signal is not received. When a DONE signal is then received, the counter value indicates the run length.

The index generator 30 operates using a unary to binary converter, taking as its input the vector formed by the outputs of the registers 122a, 122b, 122c, etc. Typically, at the end of a run, only one of the registers 122a, 122b, 122c, etc will be active, and so the required index value can easily be obtained as the index of the active register 122. If two or more of the registers 122a, 122b, 122c, etc are active, a priority encoder (not shown) can be used to select the required index value as the index of the active register 122 having the lowest index value.

The encoder 40 can then combine the outputs of the run length counter 20 and the index generator 30 to produce the required output encoded data.

As mentioned above, this structure produces output data efficiently in the form <index, runlength>. That is, the structure is efficient in the sense that it can be initialized on the fly, without needing to be halted before the next match can be detected.

As an alternative, the shift register structure can be adapted such that the compression architecture produces output data efficiently in the form <index, runlength, last symbol>. In order to produce this form of output data efficiently, the shift register structure needs to detect when any single input character matches a stored character, rather than only detecting two or more consecutive matches.

In order to detect a single input character matching a stored character, only one of the registers 116, 118 need be provided, with that register being connected to receive the signal from the AND gate 108, and the output of that register then being applied to the AND gate 120.

When the compression architecture is to produce output data in the form <index, runlength, last symbol>, it needs to include a last symbol generator, for detecting the last symbol, which is to form part of the encoded data output. The last symbol in this case is the last input to the shift register.

In an embodiment of the invention, the second register 118 can be dynamically switchable into and out of the circuit. Thus, when it is desired to produce output data in the form <index, runlength, last symbol>, the second register 118 can be switched out of the circuit, while, when it is desired to produce output data in the form <index, runlength>, the second register 118 can be switched into the circuit.

When the DONE signal has gone high, and the end of a matching character string has been detected, the encoded data is output. Thereafter, in the immediately following clock cycle, any match register 122a, 122b, 122c etc can be set, provided that the AND gate 120 is receiving high signals on its first and second inputs.

The data can therefore be continuously processed, without requiring the circuit to be stopped when the end of a matching character string is reached.

The shift register structure described above allows unlimited pipelining to be inserted, for example between the input 102 and the register 116, as required to allow the architecture to operate at the required speed.

For example, there may be pipeline delays required to forward the last input to the output, when the structure produces data in the form <index, runlength, last symbol>. Similarly, pipeline delays may be required for the unary to binary circuit in the index generator 30, and specifically the internal priority circuit, to operate at speed. Further, the run length counter 20 may be offset in time from the rest of the circuit.

The output (code word) of the circuit can be independently calculated from the main part of the circuit, and can therefore be infinitely pipelined. If the runlength exceeds an arbitrary maximum (e.g. 32), a DONE signal can be forced. If the counter is offset in timeslots from the main part of the circuit, an offset can be applied to the count value to flag an end of run. For example, if the counter starts 2 cycles after the main circuit, and the maximum run length is 32, then the end of run will be flagged when the count value is 30.

There is therefore described a circuit which allows high speed processing of received data in accordance with the Lempel-Ziv algorithm.

What is claimed is:

1. A data compression architecture, comprising:
a shift register, comprising a plurality of shift register elements;
a data input, for receiving input data characters, and for applying each received input data character to said shift register, such that said received input data character is stored in each shift register element of said shift register in turn;
comparison circuitry, associated with each shift register element of said shift register, for comparing each received input data character with a respective input data character stored in said shift register element of said shift register;
logic circuitry, associated with each shift register element of said shift register, for detecting a match when said comparison circuitry determines that the received input data character is equal to the respective input data character stored in said shift register element of said shift register;
a flush input, for receiving a data flush input signal, and for applying a received data flush input signal to the logic circuitry associated with each shift register element of said shift register, such that no match is detected by said logic circuitry when said data flush input signal is received.

2. A data compression architecture as claimed in claim 1, further comprising:
a flush shift register, comprising a plurality of flush shift register elements, each flush shift register element being associated with one of said shift register elements of said shift register, and having all input connected to said flush input, and having an output connected to the logic circuitry associated with the associated shift register element of said shift register.

3. A data compression architecture as claimed in claim 2, wherein a first flush shift register element of said flush shift register is connected to an enable input, and receives an enable signal when the data input receives a first input data character,
such that the enable signal is stored in successive flush shift register elements of said flush shift register as the first input data character is stored in the associated shift register element of said shift register, and such that said output connected to the logic circuitry associated with the associated shift register element of said shift register allows said logic circuitry to detect a match only after the first input data character has been stored in the associated shift register element of said shift register.

4. A data compression architecture as claimed in claim 1, wherein said logic circuitry comprises an AND gate, said AND gate having a first input connected to said comparison circuitry and having a second input connected to said flush input.

5. A data compression architecture as claimed in claim 2, wherein said logic circuitry comprises an AND gate, said AND gate having a first input connected to said comparison circuitry and having a second input connected to said output of said flush shift register element.

6. A data compression architecture, comprising:
means for receiving input data characters;
means for storing a plurality of received input data characters;
means for comparing each received input data character with said plurality of stored input data characters;
means for detecting a match when it is determined that the received input data character is equal to one of the stored input data characters;
means for receiving a data flush input signal, and for applying a received data flush input signal to said means for detecting a match, such that no match is detected when said data flush input signal is received; and
means for enabling said means for detecting a match, such that said means for detecting a match is operable only after an enable signal has been received, and only until a data flush input signal is received.

7. A data compression architecture, comprising:
a shift register, comprising a plurality of shift register elements;
a data input, for receiving input data characters, and for applying each received input data character to said shift register, such that said received input data character is stored in each shift register element of said shift register in turn;
comparison circuitry, associated with each shift register element of said shift register, for comparing each received input data character with a respective input data character stored in said shift register element of said shift register;
logic circuitry, associated with each shift register element of said shift register, for detecting a match when said comparison circuitry determines that the received input data character is equal to the respective input data character stored in said shift register element of said shift register in two consecutive clock cycles, and for supplying a match output when the received input data character is equal to the respective input data character stored in said shift register element of said shift register in two consecutive clock cycles and when a match output criterion is met.

8. A data compression architecture as claimed in claim 7, wherein said match output criterion is met either when a match output was output from said logic circuitry in an immediately preceding clock cycle, or when no match output was output from any logic circuitry associated with any of said shift register elements.

9. A data compression architecture as claimed in claim 7, wherein said logic circuitry is dynamically switchable such that, in a first mode, it is adapted to detect a match when said comparison circuitry determines that the received input data character is equal to the respective input data character stored in said shift register element of said shift register in two or more consecutive clock cycles, and, in a second mode, it is adapted to detect a match when said comparison circuitry determines that the received input data character is equal to the respective input data character stored in said shift register element of said shift register in one of more consecutive clock cycles.

10. A data compression architecture as claimed in claim 7, wherein said logic circuitry comprises:
   a first register, connected to said comparison circuitry to receive a first register input signal when a current received input data character is equal to a previous input data character stored in the respective shift register element of said shift register;
   a second register, connected to said first register to receive a second register input signal from an output of said first register, during a clock cycle immediately following a clock cycle during which said first register received said first register input signal, and
   an AND gate, connected to receive signals from outputs of the first register and the second register, and able to supply a match output only when the received input data character is equal to the respective input data character stored in said shift register element of said shift register in two consecutive clock cycles.

11. A data compression architecture as claimed in claim 10, wherein said logic circuitry comprises:
   a NOR gate, connected to receive match outputs from the AND gates in the logic circuitry associated with each shift register element of said shift register, and adapted to supply a DONE output signal when no match output was output from the AND gates in any logic circuitry associated with any of said shift register elements.

12. A data compression architecture as claimed in claim 11, wherein said logic circuitry associated with each of said shift register elements further comprises:
   an OR gate, connected to receive said DONE signal and to receive an input from the output of the second register, and connected to supply an OR gate output signal to said AND gate, such that said OR gate output signal indicates whether said match output criterion is met.

* * * * *